United States Patent [19]

Arbeiter

[11] Patent Number: 5,060,242
[45] Date of Patent: Oct. 22, 1991

[54] NON-DESTRUCTIVE LOSSLESS IMAGE CODER

[75] Inventor: James H. Arbeiter, Hopewell, N.J.

[73] Assignee: General Electric Company, Schenectady, N.Y.

[21] Appl. No.: 314,749

[22] Filed: Feb. 24, 1989

[51] Int. Cl.$^5$ .................... H03M 7/40; H03M 7/48
[52] U.S. Cl. ............................... 375/122; 375/27;
    358/261.1; 341/65; 341/67; 341/59
[58] Field of Search ............... 375/27, 122; 358/261.1,
    358/13, 426, 427, 133, 136, 138; 341/59, 60, 65,
    67; 364/746

[56] References Cited

U.S. PATENT DOCUMENTS

| | | | |
|---|---|---|---|
| 4,101,934 | 7/1978 | Fukuoka | 358/261.1 |
| 4,228,467 | 10/1980 | Loye et al. | 358/261.1 |
| 4,334,246 | 6/1989 | Saran | 364/900 |
| 4,376,933 | 3/1983 | Saran et al. | 364/900 |
| 4,396,906 | 8/1983 | Weaver | 358/427 |
| 4,569,058 | 2/1986 | Grallert | 375/27 |
| 4,574,382 | 3/1986 | Ko | 375/25 |
| 4,675,650 | 6/1987 | Coppersmith et al. | 341/59 |
| 4,706,260 | 11/1987 | Fedele et al. | 382/56 |
| 4,914,675 | 4/1990 | Fedele | 375/25 |

OTHER PUBLICATIONS

"32-Bit Cascadable Barrel Shifter/Normalizer General Information," Logic Devices, Inc., Product Catalog, Sunnyvale, CA, pp. 2-5, Mar. 1985.

*Primary Examiner*—Benedict V. Safourek
*Assistant Examiner*—Young Tse
*Attorney, Agent, or Firm*—Paul R. Webb, II; James C. Davis, Jr.

[57] ABSTRACT

An image signal processing system DPCM encodes the signal, then Huffman and run length encodes the signal to produce variable length code words, which are then tightly packed without gaps for efficient transmission without loss of any data. The tightly packing apparatus has a barrel shifter with its shift modulus controlled by an accumulator receiving code word length information. An OR gate is connected to the shifter, while a register is connected to the gate. Apparatus for processing a tightly packed and decorrelated digital signal has a barrel shifter and accumulator for unpacking, a Huffman and run length decoder, and an inverse DCPM decoder.

19 Claims, 2 Drawing Sheets

NON-DESTRUCTIVE LOSSLESS IMAGE CODER

BACKGROUND OF THE INVENTION

The present invention relates to coding and decoding digital data, and more particularly, to such data when representing an image, especially a medical image.

Digital data representing an image usually has a large amount of redundancy. Therefore, redundancy reducing encoding techniques such as DPCM (delta pulse code modulation), Huffman encoding, and run length encoding are used. Such encoding techniques are most efficient when producing variable length code words in accordance with the redundancy of the original data. The variable length words must be packed for transmission in a storage register. If no loss of data is to occur, the register must have a length equal to the longest possible code word. However, this results in inefficient packing for code words having less than the maximum length. If a shorter register is used, more efficient packing results, but also the loss of some data.

It is, therefore, an object of the present invention to have a coder that is both lossless and efficient in packing data, a decoder for use with the encoder, and processing apparatus using the coder and decoder.

SUMMARY OF THE INVENTION

Apparatus for processing a digital signal having successive samples comprises means for decorrelating adjacent samples of the digital signal; means for encoding the decorrelated samples into variable length code words; and means for tightly packing the variable length code words without any gaps therebetween.

Apparatus for processing a tightly packed encoded and decorrelated digital signal having code words of uniform length formed from code words of varying length comprises means for unpacking said digital signal to form the code words of varying length; means for decoding said code words of variable length to form decoded code words; and means for correlating the decoded code words.

The means for packing and unpacking can comprise a selectable modulus logic circuit; and a means for determining the shift modulus coupled to the logic circuit.

BRIEF DESCRIPTION OF THE DRAWING

In the drawing corresponding elements have been given numerals with corresponding least two significant digits.

DETAILED DESCRIPTION

Figure 1:
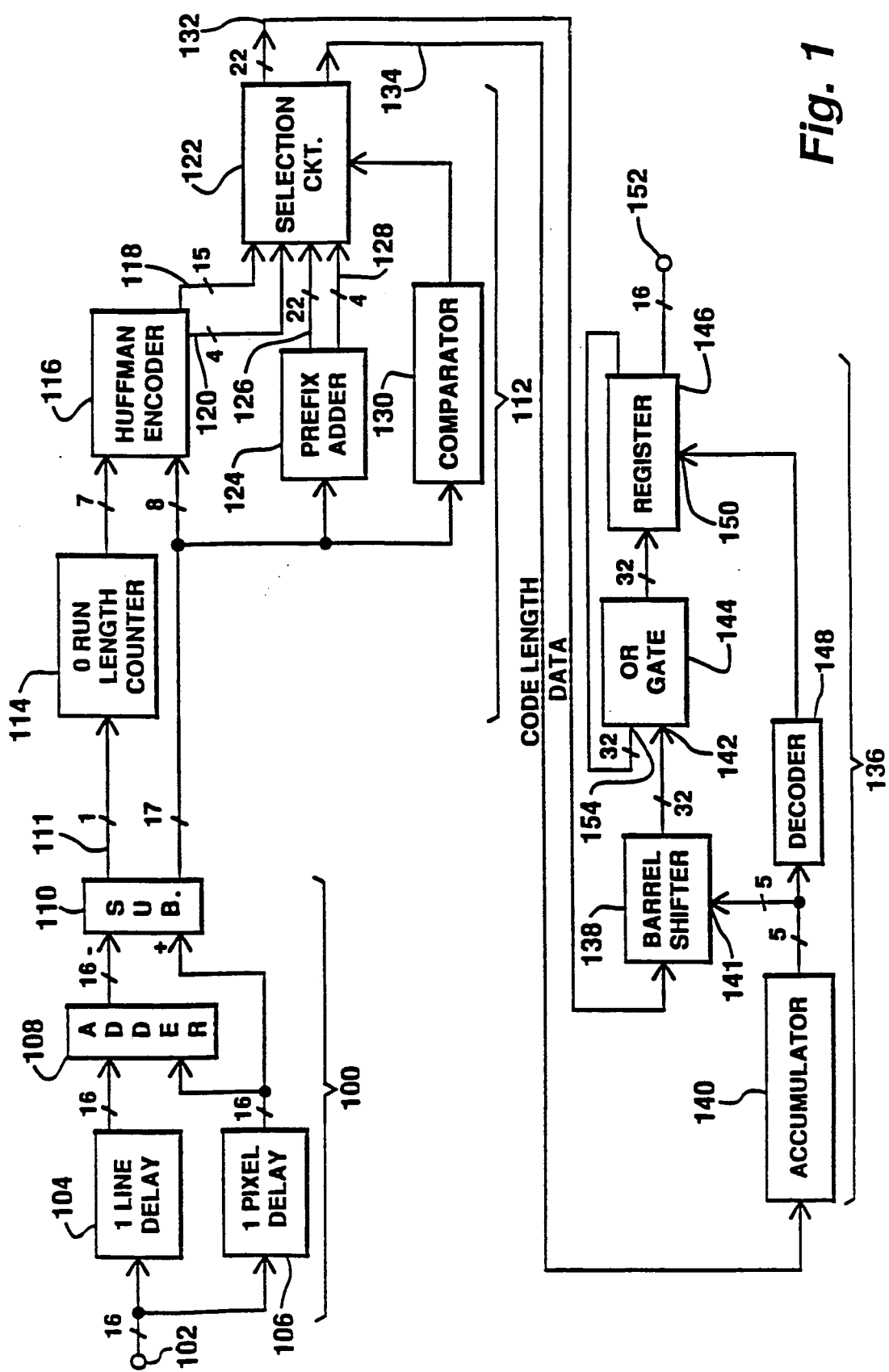
FIG. 1 is a block diagram of an embodiment of an encoder in accordance with the invention.

In FIG. 1 is shown means for decorrelating adjacent samples, such as a second order DPCM encoder 100, comprising a 16-bit input terminal 102 for receiving a digital signal, such as pixels representing a video signal from a digital camera or memory, typically at a 4.1 Mbit/sec rate. Other orders of DPCM encoders can be used. The input signal is applied to a 16-bit one line delay circuit 104 and a 16-bit one pixel period time delay circuit 106, such as clocked shift registers. The 16-bit output signals from delay circuits 104 and 106 are applied to a 16-bit adder 108. The output signal from the adder 108 is the sum of the input signals divided by two. The division can be performed by a hard wired shift one bit to the right at the output of adder 108. Thus, said output signal is an estimate of the value of the current pixel and is applied to the subtractive input of 16-bit subtractor 110, the additive input thereof receiving the one pixel delayed signal from delay circuit 106. Since the difference between two 16-bit numbers can be a 17-bit number, the subtractor 110 has a 17-bit output difference signal, which is the DPCM encoded output signal from the DCPM encoder 100. In addition, subtractor 110 provides on 1-bit line 111 a zero flag if the difference is zero.

The output signals from DPCM encoder 100 are applied to run length and Huffman encoding circuit 112. In particular, the zero flag signal is applied to a zero run length counter 114, which can count up to 128 successive pixels of zero value, and provides this count to a Huffman encoder 116, such as a ROM look up table. The presence of a zero flag stops the operation of packing circuit 136 (described below) until the flag disappears with the occurrence of non-zero pixel values. The seven least significant bits (LSB) and a sign bit of the output signal of DPCM encoder 100 representing pixel values from $-128$ to $+127$ (if the 8 MSBs are zero) are also applied to Huffman encoder 116. This is done because the most likely pixel values after DPCM encoding are near zero, and thus, data can be saved by encoding them. The output signal from Huffman encoder 116 on 15-bit line 118 is a code word of variable length from 3 to 15 bits with the most likely to occur pixel values (as determined by statistical analysis for a given application) given the shortest lengths, while that on line 120 is a 4-bit word representing the length of the code word on line 118. The code words have "prefix property," i.e., a short code word never starts a longer code word. If the 8 MSBs from subtractor 110 are not zero, the Huffman encoder 116 will still perform encoding, but its output is not selected (explained below). The signals on lines 118 and 120 are applied to selection circuit 122.

The 17-bit DPCM encoder 100 output signal is applied to prefix adder circuit 124, such as a register, that provides the 17-bit DPCM output signal and a 5-bit prefix for a total of 22-bits on line 126. The prefix indicates that an actual pixel value rather than a run length and/or Huffman encoded value is being provided to selection circuit 122. Further, circuit 124 provides a 4-bit signal on line 128 that indicates the length of the data (22-bits) on line 126.

Finally, the 17-bit difference signal from subtractor 110 is applied to comparator 130, which determines whether the value of the difference signal is at or between the selected range of $-128$ to $+127$. If so, a control signal is sent to selection circuit 122 so that its data output line 132 is connected to its input line 118 and its code length output line 134 is connected to its input line 120. If the difference signal is outside said selected range, then output line 132 is connected to line 126, while its output line 134 is connected to line 128.

In a packing circuit 136, the variable length data on line 132 is applied to a 32-bit selectable modulo logic circuit 138, such as a pair of time multiplexed 16-bit "barrel shifters," e.g., type LSH 32 made by Logic Devices, Inc. of Sunnyvale, Calif. The code length information on line 134 is applied to means for determining the modulus, such as a 5-bit accumulator 140, which can, therefore, accumulate lengths of up to 32 bits before going through zero again.

Accumulator 140 is initially at 0 and is clocked out one pixel period behind the data on line 132. As an example of the operation of accumulator 140, consider that code lengths of 3, 5, 7, and 22 are successively present on line 134. Thus, accumulator 140 will provide to a modulus or shift control input 141 of logic circuit 138 shifts of 0, 3, 8, 15, and 5, respectively, thereby tightly packing the data on line 132 into shifter 138, i.e., without any gaps. The data is read out of logic circuit 138 every clock cycle and applied to a first input 142 of 32-bit OR gate 144 (which can be implemented as two time multiplexed 16-bit OR gates). The output from gate 144 is applied to fixed length storage means, such as a 32-bit register 146 (which can be implemented as two time multiplexed 16-bit registers so as to be compatable with a 16-bit personal computer bus). A decoder 148 determines whenever accumulator 140 is at a count of 0 which corresponds to a count of 32 (or 16 if two 16-bit registers are used for register 146) and supplies a signal to read input 150 of register 146. A 16-bit time multiplexed output signal from register 146 of compressed data words is available at 16-bit output terminal 152 for transmission. A 32-bit output signal, which is the same signal as the time multiplexed output signal, is fedback to a second input 154 of gate 144. This prevents loss of data in register 146 in the storage locations not being written into until one of the 16-bit registers (not shown) is read out. The signal at output terminal 152 is normally applied to a memory (not shown) for archival purposes.

It will be appreciated that the use of variable length code words, together with tightly packing them together, provides a highly efficient system that does not lose data.

Figure 2:
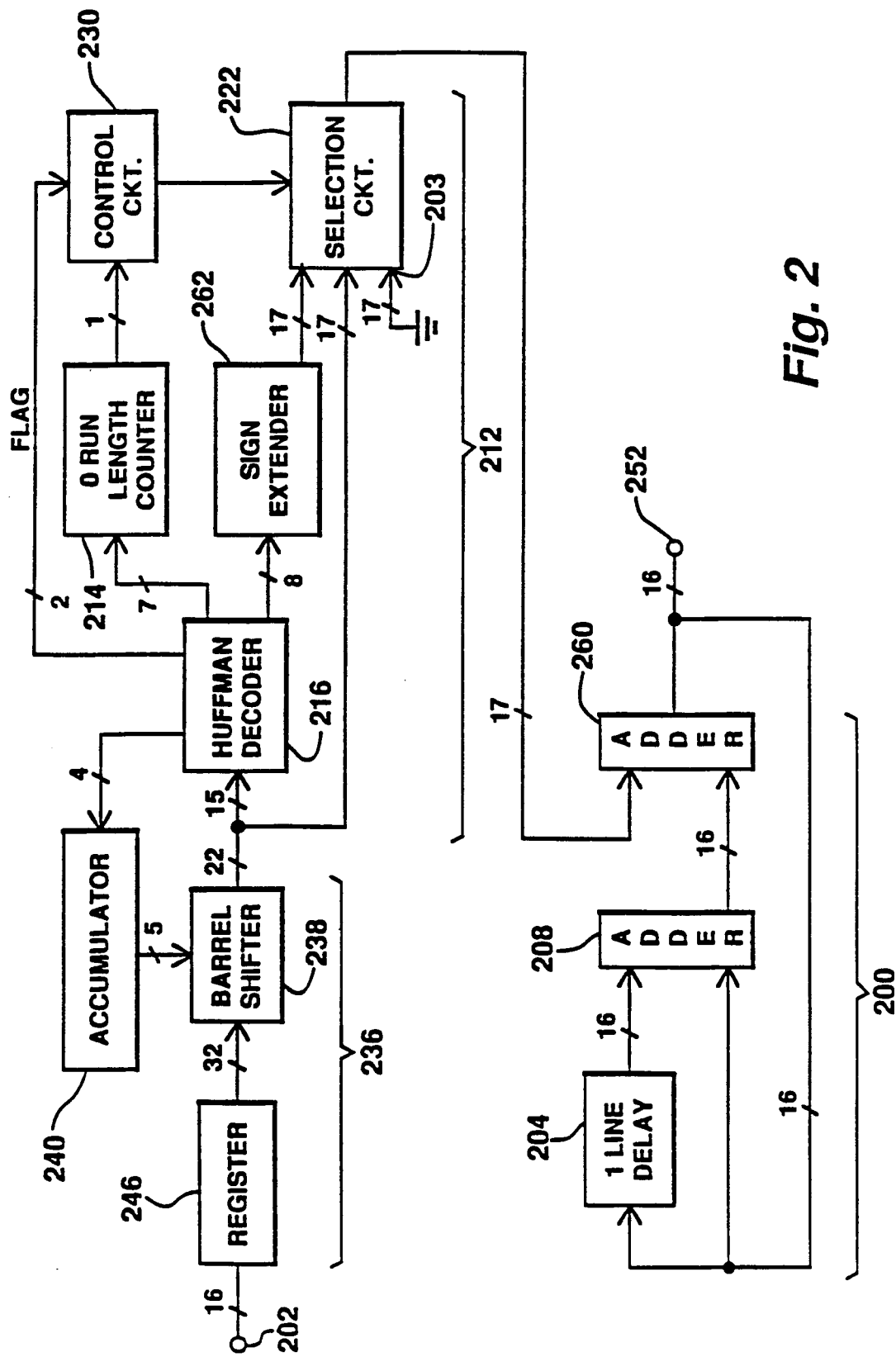
FIG. 2 is a block diagram of an embodiment of a decoder in accordance with the invention.

In FIG. 2 is shown an unpacking circuit 236 comprising a 16-bit input terminal 202 for receiving from the archival memory the compressed data word signal, which is applied to register 246. Register 246 can be implemented as two time multiplexed 16-bit registers to provide a 32-bit output signal. The 32-bit output signal from the register 246 is applied to selectable modulo logic circuit or 32-bit barrel shifter 238, which also receives a 5-bit modulus control signal from accumulator 240. Accumulator 240 is clocked one pixel period behind the pixel in shifter 236. A 22-bit unpackaged signal, i.e., one code word is present for each clock cycle is now present at the output of shifter 238, which is also the output signal of unpackaging circuit 236.

A variable length code word of from 3 to 15 bits is applied to a Huffman decoder 216, such as a ROM look up table, of a Huffman and run length decoding circuit 212. This signal is obtained from the 15 MSBs of the 22-bit output signal from shifter 238. Decoder 216 uses the 15-bit input signal as an address. The start of a code word is always aligned with the MSB of the address. The 17 LSBs of the full 22-bit signal are applied to selection circuit 222. The Huffman decoder 216 also decodes the length of the data and provides a 4-bit code length signal to accumulator 240. This is possible since each code word has the prefix property and a predetermined unique associated length. Decoder 216 determines whether a 0 run length signal, a Huffman encoded non-zero signal, or an actual DPCM signal is being received, and it supplies this information as a 2-bit flag signal to a control circuit 230, such as a combinational logic circuit. The decoder 216 also supplies a 7-bit zero run count length signal to run length counter 214, which in turn provides a 1-bit signal of successive zeroes to control circuit 230. Finally, decoder 216 provides an 8-bit Huffman decoded signal to sign extender 262, which extends the sign bit of its input signal over 9 leading bits to provide a 17-bit signal to selection circuit 222. Selection circuit 222 also has a grounded 17-bit input 203. Control circuit 230 connects the output of selection circuit 222 to the grounded input 203 when zeroes are received, to the middle input when unencoded signals are received, and to the upper input when a non-zero Huffman encoded signal is received. The output signal from selection circuit 222 is the output signal from the decoding circuit 212. When zeroes are provided by counter 214, unpacking circuit 236 is not clocked.

This output signal is applied to a correlating means, such as an inverse second order DPCM loop 200, and, in particular, to a first input of adder 260. The output signal from adder 260 is provided to 16-bit output terminal 252 and to the input of delay line 204 of one horizontal line and also to a first input of adder 208. The output signal from the delay line 204 is applied to a second input of adder 208. The output signal from adder 208 is divided by two using a hard wired shift one place to the right and, thus, is a correction of the pixel value from circuit 222. This output signal is applied to a second input of adder 260. The output signal from adder 260 is the actual value of the original pixel at input terminal 102 of FIG. 1.

What is claimed is:

1. Apparatus for packing successively occurring code words of variable length, said apparatus comprising:
   a selectable modulo logic circuit (138) for receiving the code words of variable length and having a control input (141) adapted to receive control signals for selecting the modulus of the logic circuit and providing output signals corresponding to packed code words;
   a means (140) for determining the shift modulus of said logic circuit and having an input connected to receive information representing the length of a code word and an output coupled to said control input for delivering to said control input said control signals corresponding to code lengths of said variable length code words;
   an OR gate having a first input coupled to said logic circuit, a second input, and an output; and
   a fixed length storage means having an input coupled to the output of the OR gate, a first output means coupled to the second input of the OR gate and a second output means for providing highly packed data coupled to said second input.

2. The apparatus of claim 1 wherein said selectable modulo logic circuit comprises a barrel shifter.

3. The apparatus of claim 1 wherein said determining means comprises an accumulator.

4. The apparatus of claim 1 wherein said storage means comprises a register.

5. The apparatus of claim 1 wherein said storage means has a read input and further comprising a decoder having an input coupled to said determining means and an output coupled to said read input.

6. Apparatus for processing a digital signal having successive samples to provide a tightly packed uncoded and decorrelated signal having code words of uniform length formed from code words of varying length, said apparatus comprising:
   means for decorrelating adjacent samples of the digital signal;

means for encoding the decorrelated samples into variable length code words; and means for tightly packing the variable length code words without any gaps therebetween including selectable modulo logic means for receiving the variable length code words and having a control input adaptable to receive control signals for selecting the modulus of the logic means and providing output signals corresponding to tightly packed code words and means for determining the modulus of said logic means having an input connected to receiving information corresponding to the length of the code words and an output coupled to said control input for delivering to said control input said control signals to thereby shift and tightly pack the variable length code words.

7. The apparatus of claim 6 wherein said decorrelating means comprises a DPCM encoder.

8. The apparatus of claim 7 wherein said DPCM encoder is of the second order.

9. The apparatus of claim 6 wherein said encoding means is a run length and Huffman encoder.

10. The apparatus of claim 6 wherein said selectable modulo logic means is a barrel shifter and said means for determining the modulus of said logic means comprises an accumulator adapted to provide said control signals to effect packing of the variable length code words.

11. The apparatus of claim 10 further including means for reading out the barrel shifter to provide compressed data words for transmission to an output terminal.

12. Apparatus for unpacking successively occurring code words of uniform length formed from code words of varying length, said apparatus comprising:

a selectable modulo logic circuit for receiving said code words of uniform length, and having a control input adapted to receive control signals for selecting the shift modulus of the logic circuit, and providing output signals corresponding to the varying length code words;

a decoder having an input coupled to receive said logic circuit output signals, and an output for providing a signal representing the varying length, and a means for determining the modulus of said logic circuit having an input coupled to said decoder output, and an output coupled to said control input.

13. The apparatus of claim 12 wherein said selectable modulo logic circuit comprises a barrel shifter.

14. The apparatus of claim 12 wherein said determining means comprises an accumulator.

15. Apparatus for unpacking and decoding a compressed data word signal comprising a tightly packed encoded and decorrelated digital signal having code words of uniform length formed from code words of varying length, said apparatus comprising:

means for unpacking said digital signal to form the code words of varying length including a selectable modulo logic means for receiving the data word signal and having a control input adapted to receive control signals for selecting the modulus of logic means and providing output signals corresponding to the code words of varying length and means for determining the modulus of said logic means having an input connected to receive information corresponding to the length of the data word and an output coupled to said control input for delivering said control signals to said control input;

means coupled to said logic means for receiving and decoding said code words of variable length to form decoded code words; and means for correlating the decoded code words.

16. The apparatus of claim 15 wherein said means for decoding comprises a Huffman decoder and a run length decoder.

17. The apparatus of claim 15 wherein said correlating means is an inverse DPCM decoder.

18. The apparatus of claim 17 wherein said DPCM decoder is of the second order.

19. The apparatus of claim 15 wherein said means for decoding includes selection circuit means responsive to a 2-bit flag signal developed by said means for decoding and connecting to apply the decoded code word to said means for correlating the coded words.

* * * * *